(12) United States Patent
Jiang (10) Patent No.: US 10,686,408 B2
(45) Date of Patent: Jun. 16, 2020

(54) FOUR-WAY DOHERTY AMPLIFIER AND MOBILE TELECOMMUNICATIONS BASE STATION

(71) Applicant: Ampleon Netherlands B.V., Nijmegen (NL)

(72) Inventor: Xiaochuan Jiang, Nijmegen (NL)

(73) Assignee: Ampleon Netherlands B.V., Nijmegan (NL)

( * ) Notice: Subject to any disclaimer, the term of this patent is extended or adjusted under 35 U.S.C. 154(b) by 0 days.

(21) Appl. No.: 16/048,541

(22) Filed: Jul. 30, 2018

(65) Prior Publication Data
US 2019/0036487 A1    Jan. 31, 2019

(30) Foreign Application Priority Data
Jul. 31, 2017  (CN) .................. 2017 1 06420414

(51) Int. Cl.
| | |
|---|---|
| H03F 3/68 | (2006.01) |
| H03F 1/02 | (2006.01) |
| H03F 3/193 | (2006.01) |
| H01P 5/12 | (2006.01) |
| H03H 11/16 | (2006.01) |
| H04B 1/04 | (2006.01) |
| H03F 1/56 | (2006.01) |
| H03F 3/24 | (2006.01) |
| H03F 3/60 | (2006.01) |
| H03F 3/195 | (2006.01) |

(52) U.S. Cl.
CPC ............. *H03F 1/0288* (2013.01); *H01P 5/12* (2013.01); *H03F 1/56* (2013.01); *H03F 3/193* (2013.01); *H03F 3/195* (2013.01); *H03F 3/245* (2013.01); *H03F 3/602* (2013.01); *H03H 11/16* (2013.01); *H04B 1/04* (2013.01); *H03F 2200/192* (2013.01); *H03F 2200/198* (2013.01); *H03F 2200/222* (2013.01); *H03F 2200/318* (2013.01); *H03F 2200/336* (2013.01); *H03F 2200/387* (2013.01); *H03F 2200/405* (2013.01); *H03F 2200/423* (2013.01); *H03F 2200/451* (2013.01); *H03F 2200/543* (2013.01); *H04B 2001/045* (2013.01)

(58) Field of Classification Search
CPC .................. H03F 1/0288; H03F 3/68
USPC .............................. 330/124 R, 295
See application file for complete search history.

(56) References Cited

U.S. PATENT DOCUMENTS

| | | | | |
|---|---|---|---|---|
| 6,472,934 B1 * | 10/2002 | Pehlke | .................. | H03F 1/0288 330/10 |
| 2013/0154731 A1 * | 6/2013 | Gajadharsing | ........ | H03F 1/0294 330/124 R |
| 2018/0152149 A1 * | 5/2018 | Grebennikov | .......... | H03F 3/602 |

FOREIGN PATENT DOCUMENTS

| | | |
|---|---|---|
| EP | 2403135 A9 | 3/2012 |
| WO | 2017036093 A1 | 3/2017 |

OTHER PUBLICATIONS

Extended European Search Report issued Dec. 4, 2018 for European Application No. 18185872.1 (9 pages).

(Continued)

*Primary Examiner* — Steven J Mottola
(74) *Attorney, Agent, or Firm* — McDonnell Boehnen Hulbert & Berghoff LLP (57) ABSTRACT

The present invention relates to a four-way Doherty amplifier. The invention further relates to a mobile telecommunications base station.
The invention proposes a new Doherty combiner topology that allows peak efficiencies to be reached at deeper back-off levels than conventional Doherty combiners.

15 Claims, 6 Drawing Sheets

(56) References Cited

OTHER PUBLICATIONS

X. Moronval and J. Gajadharsing, "A 100 W Multi-Band Four-Way Integrated Doherty Amplifier," 2016 IEEE MTT-S International Microwave Symposium (IMS), San Francisco, CA, May 22, 2016, pp. 1-3.

* cited by examiner

FOUR-WAY DOHERTY AMPLIFIER AND MOBILE TELECOMMUNICATIONS BASE STATION

This application claims the benefit of, and priority to, Chinese Patent Application No. 2017106420414, filed Jul. 31, 2017, the contents of which are incorporated entirely herein by reference.

The present invention relates to a four-way Doherty amplifier. The invention particularly relates to four-way Doherty amplifiers that are used in radiofrequency (RF) transmitters. Examples of such amplifiers include but are not limited to amplifiers for telecommunications base-stations, amplifiers for radar applications, and amplifiers for solid-state cooking. The invention further relates to a mobile telecommunications base station.

Within the context of the present invention, a four-way Doherty amplifier is a Doherty amplifier that comprises four distinct amplifying branches, i.e. a main amplifier branch, and three peak amplifier branches, wherein each branch comprises an amplifying element and phase delay and/or impedance transformation elements arranged before and/or after the amplifying element. The different branches differ with respect to the biasing of the amplifying element, the phase delays introduced by the phase delay elements, the impedance transformation provided by the impedance transformation elements and/or the manner in which the branches are coupled to other branches.

Doherty amplifiers are known in the art. These amplifiers are often the amplifying technique of choice in the recent broadcast and base station market. These amplifiers can provide more than 50% average efficiencies when dealing with modulated signals that have a high peak-to-average ratio. There are many different Doherty topologies, such as symmetrical and asymmetrical topologies. A symmetrical Doherty amplifier, which is built of equal size or power capable amplifiers, enhances the efficiency in a power range from a peak power level, indicated as 0 dB, down to −6 dB, the so-called "back-off" level. An asymmetrical Doherty amplifier comprises amplifiers having different power capabilities, wherein a peak amplifier generally has a larger power capability than a main amplifier, usually being up to twice that of the main amplifier. Asymmetrical Doherty amplifiers allow a peak efficiency to be reached at deeper back-off levels, i.e. <−6 dB.

In addition to two-way Doherty amplifiers, N-way Doherty amplifiers have been proposed, with N>3. An example of a four-way Doherty amplifier is for example disclosed in U.S. Pat. No. 8,928,402B2.

The known Doherty amplifiers are not without drawbacks. For example, the known two-way symmetrical Doherty amplifiers generally have the peak efficiency at 6 dB power back-off operation. The efficiency improvement for a high peak-to-average (PAR) signal is therefore limited. When using a two-way asymmetrical Doherty, the high power ratio between the main amplifier and the peak amplifier results in a high load modulation seen by the main amplifier, thereby producing a peak in efficiency at deeper back-off levels. However, the average efficiency of the Doherty amplifier will not increase proportionally to this load modulation. Moreover, increasing the load modulation will be at the expense of the bandwidth of the amplifier.

It is an object of the present invention to provide a four-way Doherty architecture offering a high efficiency at a deep back-off level without requiring a high load modulation seen by the main amplifier, thereby preventing or limiting the loss of bandwidth of the Doherty amplifier.

According to the invention, this object is achieved using the four-way Doherty amplifier as defined in claim 1. This amplifier comprises an input terminal for receiving a signal to be amplified by the four-way Doherty amplifier, a main amplifier having a main input and a main output, a first peak amplifier having a first input and a first output, a second peak amplifier having a second input and a second output, and a third peak amplifier having a third input and a third output. The four-way Doherty amplifier of the present invention further comprises an input distribution network for distributing the signal received at the input terminal to the main amplifier, the first peak amplifier, the second peak amplifier, and the third peak amplifier. Moreover, the four-way Doherty amplifier comprises a Doherty combiner for combining, at a first combining node, signals received from the main amplifier, the first peak amplifier, the second peak amplifier, and the third peak amplifier.

The Doherty combiner comprises a second branch between the first combining node (N1) and a second combining node, which second branch comprises a second impedance inverter, and wherein the third output is connected to the first combining node via a first branch. The Doherty combiner further comprises a third branch between the second combining node and the main output, which third branch comprises a third impedance inverter. The Doherty combiner further comprises a fourth branch between the second combining node and a third combining node that comprises a fourth impedance inverter, wherein the second output is connected to the third combining node via a sixth branch. The Doherty combiner also comprises a fifth branch between the first output and the third combining node that comprises a fifth impedance inverter.

Impedance inversion is an important aspect of Doherty amplifiers as it allows for the required load modulation of the main amplifier by the peak amplifiers and vice versa.

The invention provides a novel way of combining the outputs of the main amplifier, the first peak amplifier, the second peak amplifier, and the third peak amplifier so as to enable a low load modulation factor of the main amplifier while obtaining a high efficiency at large back-off operation. Moreover, the Doherty amplifier of the present invention has the advantage that it can be realized in a compact layout area using less devices, e.g. two identical push-pull devices, so that the cost and consistency of the Doherty amplifier in mass production will be significantly improved.

A signal outputted by the second peak amplifier may first combine with a signal outputted by the first peak amplifier at the third combining node to thereby form a first combined signal. Furthermore, a signal outputted by the main amplifier may first combine with the first combined signal at the second combining node to thereby form a second combined signal, and a signal outputted by the third peak amplifier may first combine with the second combined signal at the first combining node. Within the context of the present invention, a signal A first combines with a signal B at a given node if that node is the first node in the circuit, as seen from the perspective of the sources outputting the signals, at which the signals A and B co-exist.

The input distribution network and the Doherty combiner are preferably configured such that the signals amplified by the main amplifier, the first peak amplifier, the second peak amplifier, and the third peak amplifier, add substantially in-phase at the first combining node. As the phase delay in each branch of the Doherty combiner may be different, the input distribution network is preferably configured to compensate for these differences.

The Doherty combiner may be configured such that the second branch is configured to introduce a phase delay between the second combining node and the first combining node that substantially equals (90+$n_2$×180 degrees). Moreover, the third branch may be configured to introduce a phase delay between the main output and the second combining node that substantially equals (90+$n_3$×180 degrees). The fourth branch may be configured to introduce a phase delay between the third combining node and the second combining node that substantially equals (90+$n_4$×180 degrees). The fifth branch may be configured to introduce a phase delay between the first output and the third combining node that substantially equals (90+$n_5$×180 degrees). Here, $n_2$, $n_3$, $n_4$, and $n_5$ are integer numbers, e.g. −1, 0, 1, etc.

The first branch may be configured to introduce a phase delay between the third output and the first combining node that substantially equals $n_1$×180 degrees, wherein $n_1$ is an integer number, and/or wherein the sixth branch is configured to introduce a phase delay between the second output and the third combining node that substantially equals $n_6$×180 degrees, wherein $n_6$ is an integer number.

The four-way Doherty amplifier may further comprise an output terminal for outputting the combined signals to a load, and an output impedance inverter arranged in between the first combining node and the output terminal. The impedance inverter allows an impedance match between the impedance seen looking into the Doherty amplifier and the impedance of the load, the latter being typically higher than the former.

The maximum power capacities of the main amplifier, the first peak amplifier, the second peak amplifier, and the third peak amplifier may be substantially identical. This is particularly interesting when mass-producing the amplifiers as the total number of different amplifying elements can be reduced. Typically, the main amplifier and the peak amplifiers are realized on one or more packaged semiconductor dies. By having identical amplifiers, the number of different packaged products can be reduced.

Furthermore, a supply voltage supplied to the main amplifier, the first peak amplifier, the second peak amplifier, and the third peak amplifier can be substantially identical. The supply voltage typically comprises the voltage supplied to the drain terminal of the field-effect transistors (FETs) that make up the amplifiers. For example, Gallium Nitride based FETs or Silicon based laterally diffused metal oxide semiconductor (LDMOS) transistors can be used. However, the invention can equally be applied to other transistor technologies, such as bipolar transistors.

The main amplifier can be biased in class AB, whereas the first peak amplifier can be biased in class C, and the second and third peak amplifier in deep class C. The biasing of the various amplifiers determines the input level at which the amplifiers start to contribute to the signal at the output terminal of the amplifier. In general, the main amplifier is configured to amplify the signal inputted to the Doherty amplifier even at low input powers. The first to third peak amplifiers are configured to amplify the inputted signal only at relatively high input powers. In an embodiment, the first to third peak amplifiers are configured to become operational, i.e. to start amplifying the input signal, at substantially the same power of the inputted signal.

The input distribution network may comprise a seventh branch between the input terminal and the third input, an eighth branch in between the input terminal and the main input, a ninth branch between the input terminal and the first input, and a tenth branch between the input terminal and the second input. The input distribution network should preferably distribute the inputted signal to the various amplifiers such that the amplified signals add in phase at the first combining node. To this end, the input distribution network may be characterized by one or more of the following features. Firstly, the seventh branch may be configured to introduce a phase delay between the input terminal and the third input that substantially equals (270+$n_7$×180 degrees). Secondly, the eighth branch may be configured to introduce a phase delay between the input terminal and the main input that substantially equals (90+$n_8$×180 degrees). Thirdly, the ninth branch may be configured to introduce a phase delay between the input terminal and the first input that substantially equals ($n_9$×180 degrees). And, finally, the tenth branch may be configured to introduce a phase delay between the input terminal and the second input that substantially equals (90+$n_{10}$×180 degrees). In these examples, $n_7$, $n_8$, $n_9$, and $n_{10}$ are integer numbers.

The seventh branch may comprise a seventh impedance inverter, the eighth branch may comprise an eighth impedance inverter, and/or the tenth branch may comprise a tenth impedance inverter.

Alternatively, the input distribution network may comprise a first quadrature hybrid coupler (H1), a second quadrature hybrid coupler (H2), and a third quadrature hybrid coupler (H3), each of the first, second, and third quadrature hybrid couplers comprising a coupler input node, a first coupler output node, a second coupler output node, and a coupler isolated node that is terminated with a predefined load, e.g. a load that matches the characteristic impedance of the transmission lines that are used for forming the coupler such as 50 Ohm. The input terminal may be connected to the coupler input node of the first quadrature hybrid coupler, and the second coupler output node of the first quadrature hybrid coupler may be coupled to the coupler input node of the second quadrature hybrid coupler, and the first coupler output node of the first quadrature hybrid coupler may be coupled to the coupler input node of the third quadrature hybrid coupler. Furthermore, the first coupler output node of the second quadrature hybrid coupler may be coupled to the main input, the first coupler output node of the third quadrature hybrid coupler may be coupled to second input, the second coupler output node of the second quadrature hybrid coupler may be coupled to third input, and the second coupler output node of the third quadrature hybrid coupler may be coupled to first input. The input distribution network may further comprise an eighth impedance inverter ($Z_{O8}$) arranged in between the first coupler output node of the second quadrature hybrid coupler and the main input.

At least one of the first, second, third, fourth, fifth, sixth, seventh, eighth, ninth, tenth, and output impedance inverters may comprise a quarter-wavelength transmission line, such as a quarter-wavelength micro-strip line, or an electrical equivalent thereof. The skilled person will appreciate that transmission lines having an electrical length that slightly deviates from a quarter-wavelength will equally qualify as an impedance inverter. More in particular, within the context of the present invention, an impedance inverter should be construed as an electrical device, which, when connected at its output to a high impedance, will display a lower input impedance than in cases when it is connected at its output to a low impedance. It will therefore invert the behavior of the impedance connected at the output.

The impedance inverter can also be realized using pi-networks, for instance comprising a series inductance that is connected on both terminals to a grounded capacitance. Here, the series inductance can be realized using a piece of transmission line and the capacitances can be realized with discrete or integrated capacitors.

Each amplifier of the main amplifier, the first peak amplifier, the second peak amplifier, and the third peak amplifier, may comprise a power transistor (10, 11, 12, 13) having a transistor input and a transistor output. The four-way Doherty amplifier may then further comprise a main input matching network $Zin0_{match}$ connected to the transistor input of the power transistor of the main amplifier, a first input matching network $Zin1_{match}$ connected to the transistor input of the power transistor of the first peak amplifier, a second input matching network $Zin2_{match}$ connected to the transistor input of the power transistor of the second peak amplifier, a third input matching network $Zin3_{match}$ connected to the transistor input of the power transistor of the third peak amplifier, a main output matching network $Zout0_{match}$ connected to the transistor output of the power transistor of the main amplifier, a first output matching network $Zout1_{match}$ connected to the transistor output of the power transistor of the first peak amplifier, a second output matching network $Zout2_{match}$ connected to the transistor output of the power transistor of the second peak amplifier, and a third output matching network $Zout3_{match}$ connected to the transistor output of the power transistor of the third peak amplifier.

Typically, the optimal impedance to be connected to the output, e.g. drain, of the power transistor is relatively low. The output matching networks above provide an at least partial impedance match between the relatively low optimal impedance and the impedance required by the load of the Doherty amplifier, which is typically 50 Ohm. Similar considerations hold at the input.

The main output matching network $Zout0_{match}$ may substantially form the third impedance inverter ($Z_{03}$), and/or the first output matching network $Zout1_{match}$ may substantially form the fifth impedance inverter ($Z_{05}$). Additionally or alternatively, the first branch may comprise the third output matching network $Zout3_{match}$ and a phase delay component ($Z_{01}$) for introducing a phase delay equaling $90+n_1 \times 180$ degrees, and/or the sixth branch may comprise the second output matching network $Zout2_{match}$ and a phase delay component ($Z_{06}$) for introducing a phase delay equaling $90+n_6 \times 180$ degrees, wherein $n_1$ and $n_6$ are integer numbers. Hence, the output matching networks at the outputs of the power transistors can perform both as impedance matching element and as impedance inversion element.

At least two of the main input matching network $Zin0_{match}$, the first input matching network $Zin1_{match}$, the second input matching network $Zin2_{match}$, and the third input matching network $Zin3_{match}$, may be identical, and/or at least two of the main output matching network $Zout0_{match}$, the first output matching network $Zout1_{match}$, the second output matching network $Zout2_{match}$, and the third output matching network $Zout3_{match}$, may be identical. In an embodiment, all the aforementioned input matching networks are identical and/or all the aforementioned output matching networks are identical.

The power transistors of the main amplifier and the third peak amplifier may be arranged on a single semiconductor die, and/or the power transistors of the first peak amplifier and the second peak amplifier may be arranged on a single semiconductor die, or the power transistors of the main amplifier, the first peak amplifier, the second peak amplifier, and the third peak amplifier may be integrated on a single die. In an embodiment, the die on which the third peak amplifier and the main amplifier are realized is identical to the die on which the first and second peak amplifiers are realized. This reduces the complexity and costs that are associated with handling different dies in a manufacturing process.

At least part of the input and/or output matching network corresponding to the power transistor of the main amplifier, the first peak amplifier, the second peak amplifier, and the third peak amplifier may be integrated on the same die as the power transistor. For example, the input and/or output matching networks may comprise capacitive elements. These elements may be realized as integrated capacitors on the semiconductor dies.

The power transistors of the main amplifier and the third amplifier may be integrated in a single package, and/or the power transistors of the first amplifier and the second amplifier may be integrated in a single package, or the power transistors of the main amplifier, the first peak amplifier, the second peak amplifier, and the third peak amplifier may be integrated in a single package. Again, the complexity and costs that are associated with handling different packages in a manufacturing process may be reduced.

At least part of the input and/or output matching network corresponding to the power transistor of the main amplifier, the first peak amplifier, the second peak amplifier, and the third peak amplifier may be integrated in the same package as said power transistor. The input and/or output matching network may be distributed over any combination of the following elements, the semiconductor die, the package in which the die is arranged, and the printed circuit board on which the package is mounted. Alternatively, the input and/or output matching network is fully realized in one of these elements.

In a particular embodiment, the main amplifier, the first peak amplifier, the second peak amplifier, and the third peak amplifier are identical. This does not implicate that the amplifiers are biased identically but merely indicates that the physical build up of the amplifiers, e.g. transistor size, number of transistor elements, matching circuitry etc., is identical for each amplifier.

According to a second aspect, the invention provides a mobile telecommunications base station comprising the four-way Doherty amplifier as described above. The invention can equally be applied in other applications that require amplification of a radiofrequency (RF) signal. For example, the amplifier of the present invention can be used in a solid-state cooking apparatus or RADAR systems.

Next, the present invention will be described referring to the appended drawings, wherein.

Figure 1:
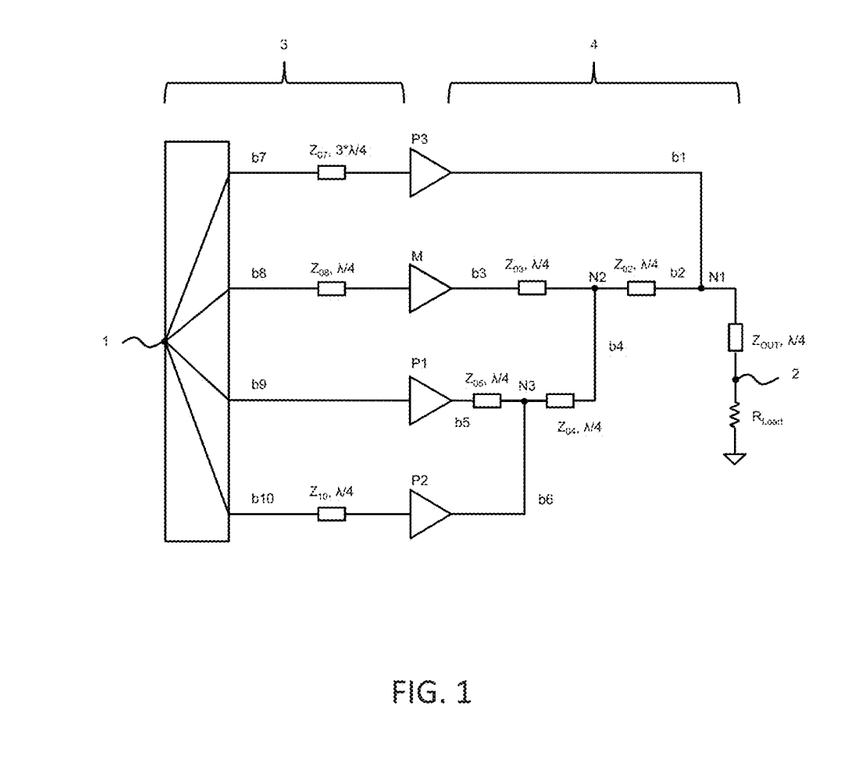
FIG. 1 illustrates a schematic layout of an amplifier in accordance with the present invention.

FIG. 1 illustrates a schematic layout of an amplifier in accordance with the present invention. This architecture provides a novel way of combining the outputs of the main, first peak, second peak and third peak amplifiers resulting in a small load modulation factor of the main amplifier while obtaining a high efficiency at large back-off operation. In FIG. 1, a signal inputted at input terminal 1 of the Doherty amplifier, is split using an input distribution network 3 to a main M, first peak P1, second peak P2, and third peak P3 amplifier. The signals amplified by these amplifiers are collected and combined by Doherty combiner 4 and are delivered at an output terminal 2 to a load $R_{LOAD}$.

Combiner 4 comprises a first branch b1 that extends from the output of third peak amplifier P3 to a first combining node N1. This node is connected via an impedance inverter $Z_{OUT}$ to load $R_{LOAD}$.

Combiner 4 further comprises a second branch b2 that extends between a second combining node N2 and first combining node N1. Second branch b2 comprises an impedance inverter $Z_{02}$. A third branch extends between an output of main amplifier M to second combining node N2, which branch comprises an impedance inverter $Z_{03}$. A fourth branch b4 extends from second combining node N2 to a third combining node N3. This branch comprises an impedance inverter $Z_{04}$. The output of first peak amplifier P1 is connected, via an impedance inverter $Z_{05}$ comprised in a fifth branch b5, to third combining node N3. This latter node is also connected via a sixth branch b6 to the output of second peak amplifier P2.

Input distribution network 3 comprises a seventh b7, eighth b8, ninth b9, and tenth b10 branch to distribute the signals to the amplifiers P3, M, P1, P2, respectively. These branches comprise an impedance inverter $Z_{07}$, an impedance inverter $Z_{08}$, no impedance inverter, and an impedance inverter $Z_{10}$, respectively.

In FIG. 1, the notation n×λ/4 denotes a phase delay introduced by an impedance inverter that is equal to n times a quarter-wavelength, wherein n is an integer number.

A simulation study on the layout of FIG. 1 has revealed that favorable values can be obtained if the power ratio of the amplifiers is set to 1:1:1:1 at the same supply voltage and if the peak amplifiers are configured to turn-on at the same power level of the signal inputted to the Doherty amplifier. In these cases, a single maximum efficiency point at 9.5 dB power back-off may be obtained while not exceeding a load modulation factor of 2.25 for the main amplifier.

Figure 2:
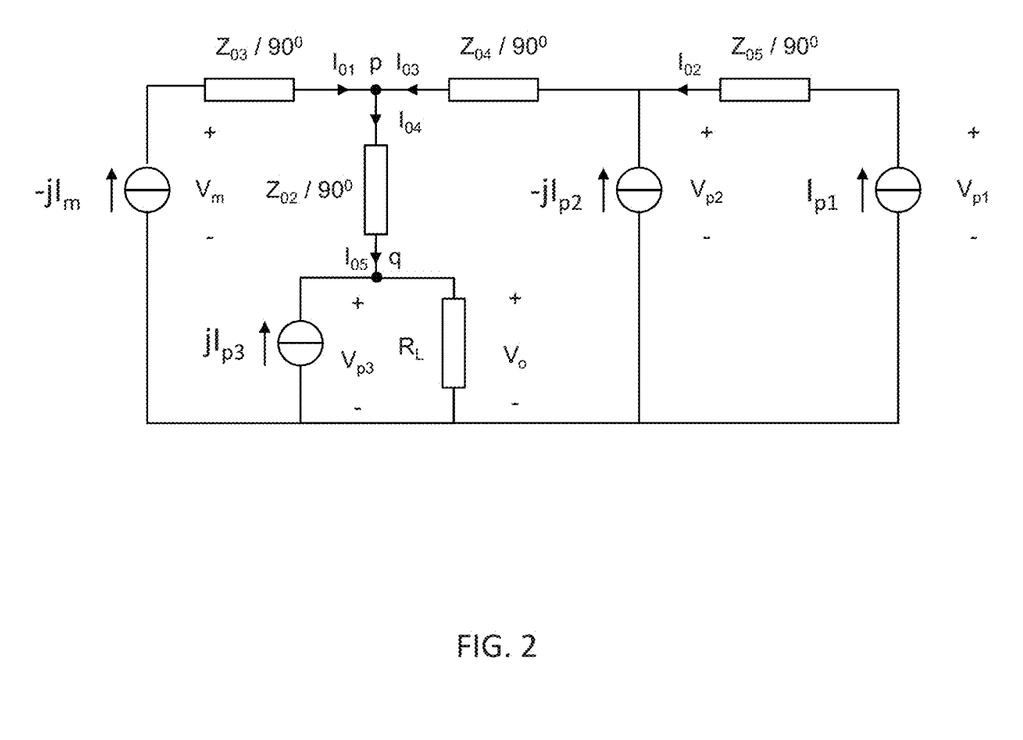
FIG. 2 illustrates an electrical equivalent circuit to be used for the electrical analysis of the amplifier in FIG. 1.
Figure 3:
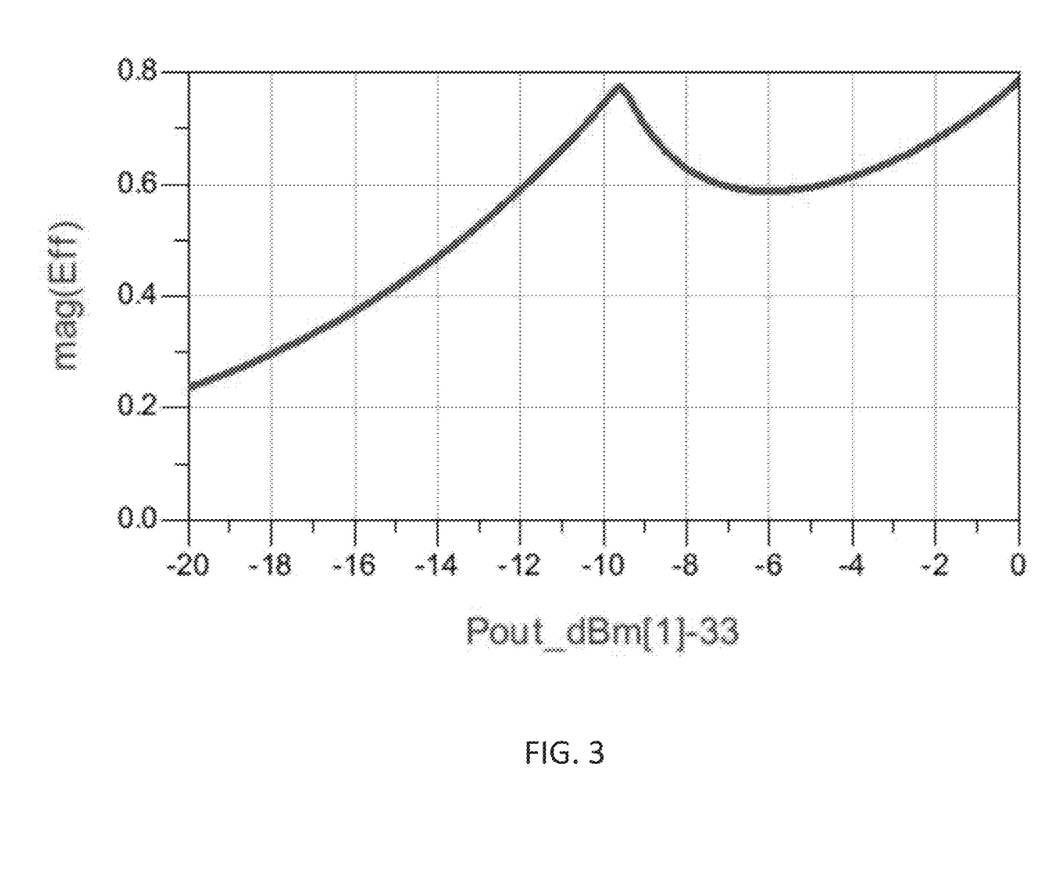
FIG. 3 illustrates the efficiency of the amplifier in FIG. 1 as a function of output power.

Next, the abovementioned simulation study will be explained in more detail referring to FIG. 2, which illustrates an electrical equivalent circuit of the layout in FIG. 1 with the exception that impedance inverter $Z_{OUT}$ and $R_{LOAD}$ are replaced by a single load $R_L$. The analysis will provide design equations for the characteristic impedances of the impedance inverters in output combiner. In the analysis, it is assumed that each amplifier has been designed to provide optimal performance, in terms of efficiency and/or maximum power, when it is connected to a 50 Ohm load.

The impedance inverters in Doherty combiner 4 can be described by the relationship between the input and output currents and voltages:

$$\begin{bmatrix} V_m \\ -jI_m \end{bmatrix} = \begin{bmatrix} 0 & jZ_{03} \\ j/Z_{03} & 0 \end{bmatrix} \begin{bmatrix} V_p \\ I_{o1} \end{bmatrix} \quad (1)$$

$$\begin{bmatrix} V_{p1} \\ I_{p1} \end{bmatrix} = \begin{bmatrix} 0 & jZ_{05} \\ j/Z_{05} & 0 \end{bmatrix} \begin{bmatrix} V_{p2} \\ I_{o2} \end{bmatrix} \quad (2)$$

$$\begin{bmatrix} V_{p2} \\ I_{o2} - jI_{p2} \end{bmatrix} = \begin{bmatrix} 0 & jZ_{04} \\ j/Z_{04} & 0 \end{bmatrix} \begin{bmatrix} V_p \\ I_{o3} \end{bmatrix} \quad (3)$$

$$\begin{bmatrix} V_p \\ I_{o4} \end{bmatrix} = \begin{bmatrix} 0 & jZ_{02} \\ j/Z_{02} & 0 \end{bmatrix} \begin{bmatrix} V_{p3} \\ I_{o5} \end{bmatrix} \quad (4)$$

Applying Kirchhoff's law at nodes p and q:

$$I_{o1} + I_{o3} - I_{o4} = 0 \quad (5)$$

$$I_{o5} + jI_{p3} - \frac{V_{p3}}{R_L} = 0 \quad (6)$$

$$V_{p3} = V_o$$

wherein the maximum voltage at node p is not restricted by any of the current sources but determined by the choice of the characteristic impedances $Z_{03}$, $Z_{02}$, and $Z_{04}$. This implies that one of these values has to be set in advance in the design process.

The currents of the amplifiers are assumed to be fundamental current amplitudes $I_m$, $I_{p1}$, $I_{p2}$, and $I_{p3}$, at any given input signal amplitude $v_{in}$, where $I_m = f_m(v_{in})$ and $I_p = f_p(v_{in})$, wherein $f_m$ and $f_p$ are assumed to be simple piecewise linear functions. A short circuit termination is assumed for the harmonics.

The output current and voltage of each impedance inverter can be expressed as a function of the input current and voltage from (1)-(4):

From (1): $\begin{cases} V_m = jZ_{03}I_{o1} & (8) \quad \text{hence} \quad I_{o1} = \dfrac{V_m}{jZ_{03}} \quad (9) \\ I_m = -V_p/Z_{03} & (10) \quad \text{hence} \quad V_p = -Z_{03}I_m \quad (11) \end{cases}$ From (2): $\begin{cases} V_{p1} = jZ_{05}I_{o2} & (12) \quad \text{hence} \quad I_{o2} = \dfrac{V_{p1}}{jZ_{05}} \quad (13) \\ I_{p1} = jV_{p2}/Z_{05} & (14) \quad \text{hence} \quad V_{p2} = -jZ_{05}I_{p1} \quad (15) \end{cases}$ From (3): $\begin{cases} V_{p2} = jZ_{04}I_{o3} & (16) \quad \text{hence} \quad I_{o3} = \dfrac{V_{p2}}{jZ_{04}} \quad (17) \\ I_{o2} - jI_{p2} = jV_p/Z_{04} & (18) \quad \text{hence} \quad V_p = -jZ_{04}(I_{o2} - jI_{p2}) \quad (19) \end{cases}$ From (4): $\begin{cases} V_p = jZ_{02}I_{o5} & (20) \quad \text{hence} \quad I_{o5} = \dfrac{V_p}{jZ_{02}} \quad (21) \\ I_{o4} = jV_{p3}/Z_{02} & (22) \quad \text{hence} \quad V_{p3} = -jZ_{02}I_{o4} \quad (23) \end{cases}$ The relationship between $R_L$ and $R_{mF}$, which is the optimal load to be presented at the output of the main amplifier, can be determined under full power conditions. In this case, the total output power of the Doherty amplifier $P_{o\_tot}$ can be computed using:

$$P_{o\_tot} = \frac{V_{omax}^2}{2R_L} = \frac{V_{mF}^2}{2R_{mF}} + \frac{V_{p1F}^2}{2R_{p1F}} + \frac{V_{p2F}^2}{2R_{p2F}} + \frac{V_{p3F}^2}{2R_{p3F}} \text{ in which } V_{omax} = V_{p3F} = V_{dd}$$

wherein $V_{o\_max}$ is the maximum voltage at the output, $V_{mF}$ the voltage at the output of the main amplifier under full power conditions, and $V_{p1F}$, $V_{p2F}$, $V_{p3F}$ the corresponding voltages at the first, second, and third peak amplifiers, and wherein $R_{p1F}$, $R_{p2F}$, $R_{p3F}$ the optimal load to be presented at the output of the first, second, and third peak amplifier, respectively, under full power conditions.

As a single supply voltage and a power ration of 1:1:1:1 are assumed, the following holds:

$$R_{mF} = R_{p1F} = R_{p2F} = R_{p3F}$$

and therefore:

$$\frac{R_{mF}}{R_L} = 4 \tag{7}$$

A linear dependency between $I_m$ and the RF input voltage $v_{in}$ is assumed. The main amplifier current at back-off ($I_{mB}$) can therefore be expressed as $I_{mB} = k \times I_{mF}$, wherein k is the input voltage under back-off conditions at which maximum efficiency is achieved. Next, expressions for the impedance inverters will be derived.

Substituting (9), (17), and (22) in (5) gives:

$$I_{o1} + I_{o3} - I_{o4} = 0 \; (5) \Leftrightarrow \frac{V_m}{jZ_{03}} + \frac{V_{p2}}{jZ_{04}} - \frac{jV_{p3}}{Z_{o2}} = 0$$

Further substituting equation (15) gives:

$$\frac{V_m}{jZ_{03}} - \frac{Z_{05}I_{p1}}{Z_{04}} - \frac{jV_{p3}}{Z_{o2}} = 0 \tag{24}$$

Substituting equation (21) in equation (6) gives:

$$I_{o5} + jI_{p3} - \frac{V_{p3}}{R_L} = 0 \Leftrightarrow \frac{V_p}{jZ_{02}} + jI_{p3} - \frac{V_{p3}}{R_L} = 0 \tag{25}$$

Further substituting equation (11) provides:

$$\frac{-Z_{03}I_m}{jZ_{02}} + jI_{p3} - \frac{V_{p3}}{R_L} = 0 \tag{26}$$

And from equation (26) it can be derived that:

$$V_{p3} = jR_L I_{p3} - \frac{Z_{03}R_L I_m}{jZ_{02}} \tag{27}$$

Substituting equation (27) in equation (24) gives:

$$\frac{V_m}{jZ_{03}} - \frac{Z_{05}I_{p1}}{Z_{04}} + \frac{R_L I_{p3}}{Z_{02}} + \frac{Z_{03}R_L I_m}{Z_{02}^2} = 0 \tag{28}$$

Evaluation of equation (28) at back-off and full power will provide the first relationships between the characteristic impedances of the impedance inverters.

At the back-off point the following conditions apply:

$$V_{mB} = -jV_{dd}, \; I_{mB} = I_{mF}k, \; I_{p1B} = I_{p2B} = I_{p3B} = 0$$

Substituting in equation (28) provides:

$$\frac{V_{mB}}{jZ_{03}} - \frac{Z_{05}I_{p1B}}{Z_{04}} + \frac{R_L I_{p3B}}{Z_{02}} + \frac{Z_{03}R_L I_{mB}}{Z_{02}^2} = \tag{29}$$

$$0 \Leftrightarrow \frac{-jV_{dd}}{jZ_{03}} + \frac{Z_{03}R_L I_{mF}k}{Z_{02}^2} =$$

$$0 \Rightarrow \frac{V_{dd}}{Z_{03}} = \frac{Z_{03}R_L I_{mF}k}{Z_{02}^2} \Rightarrow \frac{V_{dd}Z_{02}^2}{R_L I_{mF}k} = Z_{03}^2 \Rightarrow \frac{Z_{03}}{Z_{02}} = \sqrt{\frac{R_{mF}}{R_L k}}$$

At full power, the following conditions apply:

$$V_{mF} = -jV_{dd}, \; V_{p1F} = V_{dd}, \; V_{p2F} = -jV_{dd}, \; V_{p3F} = jV_{dd}$$

$$I_m = I_{mF}, \; I_{p1} = I_{p1F}, \; I_{p2} = I_{p2F}, \; I_{p3} = I_{p2F}$$

Where it is assumed that:

$$I_{mF} = I_{p1F} = I_{p2F} = I_{p2F}$$

Substituting in equation (28) gives:

$$\frac{V_{mF}}{jZ_{03}} - \frac{Z_{05}I_{p1F}}{Z_{04}} + \frac{R_L I_{p3F}}{Z_{02}} + \frac{Z_{03}R_L I_{mF}}{Z_{02}^2} = \tag{30}$$

$$0 \Leftrightarrow \frac{-jV_{dd}}{jZ_{03}} - \frac{Z_{05}I_{mF}}{Z_{04}} + \frac{R_L I_{mF}}{Z_{02}} + \frac{Z_{03}R_L I_{mF}}{Z_{02}^2} =$$

$$0 \Rightarrow \frac{-V_{dd}}{Z_{03}} = \frac{Z_{05}I_{mF}}{Z_{04}} - \frac{R_L I_{mF}}{Z_{02}} - \frac{Z_{03}R_L I_{mF}}{Z_{02}^2} \Leftrightarrow \frac{-R_{mF}}{Z_{03}} =$$

$$\frac{Z_{05}}{Z_{04}} - \frac{R_L}{Z_{02}} - \frac{Z_{03}R_L}{Z_{02}^2} \Rightarrow \frac{Z_{05}}{Z_{04}} = \frac{R_L}{Z_{02}} + \frac{Z_{03}R_L}{Z_{02}^2} - \frac{R_{mF}}{Z_{03}}$$

Substituting equation (13) in equation (19) gives:

$$V_p = -jZ_{04}(I_{o2} - jI_{p2}) \Leftrightarrow V_p = -jZ_{04}\left(\frac{V_{p1}}{jZ_{05}} - jI_{p2}\right) \tag{31}$$

Substituting equation (31) in equation (25) gives:

$$\frac{V_p}{jZ_{02}} + jI_{p3} - \frac{V_{p3}}{R_L} = 0 \Leftrightarrow j\frac{Z_{04}V_{p1}}{Z_{02}Z_{05}} + j\frac{Z_{04}I_{p2}}{Z_{02}} + jI_{p3} - \frac{V_{p3}}{R_L} = 0 \tag{32}$$

At the back-off point the following conditions apply:

$$V_{mB} = -jV_{dd}, \; I_{mB} = I_{mF}k, \; I_{p1B} = I_{p2B} = I_{p3B} = 0,$$
$$V_{p3B} = jbV_{dd}$$

wherein b is the back-off output voltage where maximum efficiency occurs. Substituting in equation (32) gives:

$$\frac{Z_{04}V_{p1B}}{Z_{02}Z_{05}} + j\frac{Z_{04}I_{p2B}}{Z_{02}} + jI_{p3B} - \frac{V_{p3B}}{R_L} = \qquad (33)$$

$$0 \Leftrightarrow j\frac{Z_{04}V_{p1B}}{Z_{02}Z_{05}} - \frac{jbV_{dd}}{R_L} = 0 \Rightarrow \frac{Z_{04}}{Z_{02}Z_{05}} = \frac{bV_{dd}}{V_{p1B}R_L}$$

Substituting equations (11) and (13) in equation (19) gives:

$$V_p = -jZ_{04}(I_{o2} - jI_{p2}) \Leftrightarrow -Z_{03}I_m = -jZ_{04}\left(\frac{V_{p1}}{jZ_{05}} - jI_{p2}\right) \qquad (34)$$

At the back-off point the following conditions apply:

$V_{mB} = -jV_{dd}$, $I_{mB} = I_{mF}k$, $I_{p1B} = I_{p2B} = I_{p3B} = 0$

Substituting in equation (34) gives:

$$-Z_{03}I_{mB} = \qquad (35)$$

$$-jZ_{04}\left(\frac{V_{p1B}}{jZ_{05}} - jI_{p2B}\right) \Leftrightarrow Z_{03}I_{mF}k = \frac{Z_{04}V_{p1B}}{Z_{05}} \Rightarrow V_{p1B} = \frac{Z_{03}Z_{05}}{Z_{04}}I_{mF}k$$

Substituting equation (35) in equation (33) provides:

$$\frac{Z_{04}}{Z_{02}Z_{05}} = \frac{bV_{dd}}{V_{p1B}R_L} \Leftrightarrow \frac{Z_{04}}{Z_{02}Z_{05}} = \frac{bV_{dd}}{I_{mF}kR_L}\frac{Z_{04}}{Z_{03}Z_{05}} \Rightarrow \frac{Z_{03}}{Z_{02}} = \frac{bR_{mF}}{kR_L} \qquad (36)$$

Equating equations (29) and (36) gives:

$$\sqrt{\frac{R_{mF}}{R_Lk}} = \frac{bR_{mF}}{kR_L} \Rightarrow \frac{R_{mF}}{R_Lk} = \left(\frac{bR_{mF}}{kR_L}\right)^2 \Rightarrow 1 = \frac{b^2R_{mF}}{kR_L} \Rightarrow k = \frac{b^2R_{mF}}{R_L} \qquad (38)$$

At full power, the following conditions apply:

$V_{mF} = -jV_{dd}$, $V_{p1F} = V_{dd}$, $V_{p2F} = -jV_{dd}$, $V_{p3F} = jV_{dd}$ $I_m = I_{mF}$, $I_{p1} = I_{p1F}$, $I_{p2} = I_{p2F}$, $I_{p3} = I_{p2F}$

Assuming $I_{mF} = I_{p1F} = I_{p2F} = I_{p2F}$

Substituting in equation (34) gives:

$$-Z_{03}I_{mF} = -jZ_{04}\left(\frac{V_{p1F}}{jZ_{05}} - jI_{p2F}\right) \Leftrightarrow -Z_{03}I_{mF} = \qquad (39)$$

$$-jZ_{04}\left(\frac{V_{dd}}{jZ_{05}} - jI_{mF}\right) \Leftrightarrow Z_{03}I_{mF} =$$

$$\frac{V_{dd}Z_{04}}{Z_{05}} + I_{mF}Z_{04} \Rightarrow Z_{03} = \frac{R_{mF}Z_{04}}{Z_{05}} + Z_{04} \Rightarrow Z_{04} = \frac{Z_{03}}{\frac{R_{mF}}{Z_{05}}+1}$$

Substituting equation (39) in equation (30) gives:

$$\frac{Z_{05}}{Z_{03}}\left(\frac{R_{mF}}{Z_{05}}+1\right) = \frac{R_L}{Z_{02}} + \frac{Z_{03}R_L}{Z_{02}^2} - \frac{R_{mF}}{Z_{03}} \Rightarrow R_{mF} + Z_{05} =$$

$$\frac{R_LZ_{03}}{Z_{02}} + \frac{Z_{03}^2R_L}{Z_{02}^2} - R_{mF} \Rightarrow Z_{05} = \frac{R_LZ_{03}}{Z_{02}} + \frac{Z_{03}^2R_L}{Z_{02}^2} - 2R_{mF}$$

Substituting equation (29) gives an explicit expression for $Z_{05}$:

$$Z_{05} = \qquad (40)$$

$$R_L\sqrt{\frac{R_{mF}}{R_Lk}} + R_L\frac{R_{mF}}{R_Lk} - 2R_{mF} \Leftrightarrow Z_{05} = \sqrt{\frac{R_LR_{mF}}{k}} + \frac{R_{mF}}{k} - 2R_{mF}$$

The design flow for combiner 4 can be described in the following manner. First, back-off output voltage b is chosen. When targeting at maximum efficiency at −9.5 dB back-off, b can be calculated using:

$$b = 10^{\frac{-9.5}{20}} = \frac{1}{3}$$

Choosing the relationship between $R_{mF}$ and $R_L$:

$$\frac{R_{mF}}{R_L} = 4 \qquad (7)$$

Allows k to be computed using:

$$k = \frac{b^2R_{mF}}{R_L} \qquad (38)$$

Selecting a value for $Z_{03}$ allows the remaining characteristic impedances to be calculated using:

$$Z_{02} = Z_{03}\sqrt{\frac{R_Lk}{R_{mF}}} \qquad (29)$$

$$Z_{05} = \sqrt{\frac{R_LR_{mF}}{k}} + \frac{R_{mF}}{k} - 2R_{mF} \qquad (40)$$

$$Z_{04} = \frac{Z_{04}}{\frac{R_{mF}}{Z_{06}}+1} \qquad (39)$$

The load modulation ($VSWR_{main}$) experienced by the main amplifier can be expressed as:

$$VSWR_{main} = \frac{R_{mB}}{R_{mF}} = \frac{V_{mB}/I_{mB}}{V_{mF}/I_{mF}} = \frac{V_{dd}/(I_{mF}k)}{V_{dd}/I_{mF}} \Leftrightarrow VSWR_{main} = \frac{1}{k} \qquad (43)$$

NUMERICAL EXAMPLE

As a numerical example the following design parameters were set:
$R_{mF}=1$
$R_L=\frac{1}{4}$
$Z_{03}=1$ Back off for peak efficiency=BO=−9.542 dB Using the equations above, the following characteristics can be computed:

$b=1/3$ $k=4/9$ $VSWR_{main}=2.25$ $Z_{02}=1/3$ $Z_{05}=1$ $Z_{04}=1/2$ where the impedances were normalized using 50 Ohm. In other words, $Z_{02}=16.7$ Ohm, $Z_{03}=50$ Ohm, $Z_{04}=25$ Ohm, and $Z_{05}=50$ Ohm.

The numerical example demonstrates that with the layout of the present invention, peak efficiencies can be reached at deep back-off levels without requiring a large load modulation for the main amplifier.

Figure 4:
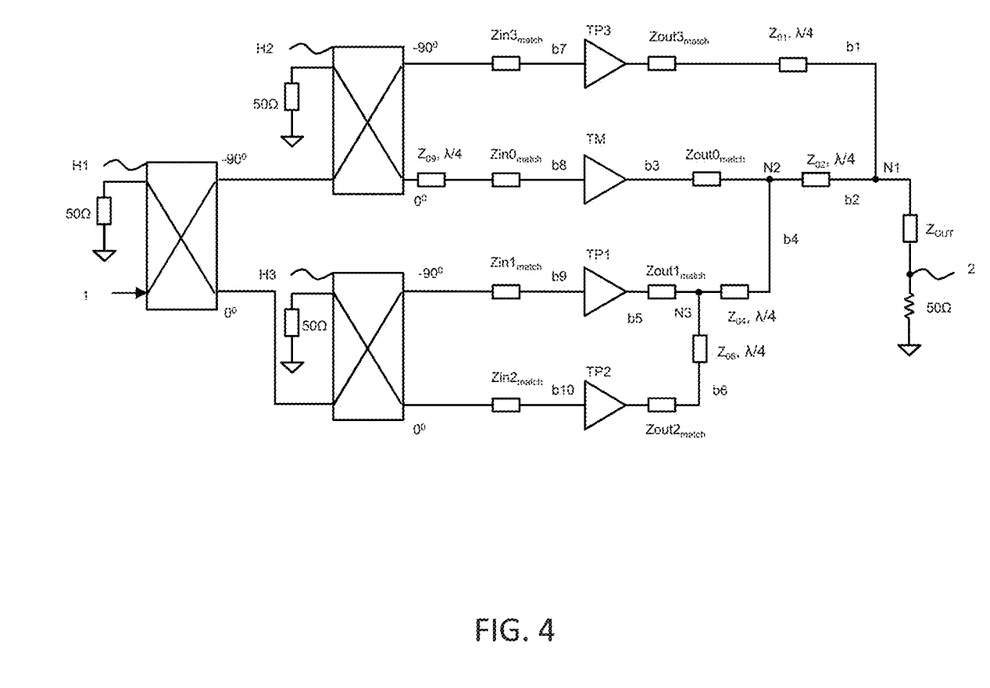
FIG. 4 illustrates a schematic layout of an implementation of an amplifier in accordance with the present invention.

FIG. 4 illustrates a schematic layout of an implementation of a Doherty amplifier in accordance with the present invention. Here, input distributing network 3 is realized using quadrature hybrid couplers H1-H3. Each of these couplers comprises an input port, a first output port that has a phase delay of about 0 degrees relative to the input port, a second output port that has a phase delay of about 90 degrees relative to the input port, and an isolated port that is terminated with the characteristic impedance that corresponds to the coupler, which in most cases equals 50 Ohm.

The network of hybrid couplers introduces phase delays in the various branches. These phase delays should be matched with the phase delays introduced in Doherty combiner 4 such that the amplified signals combine in phase at first combining node N1.

In addition, compared to FIG. 1, amplifiers M, P1, P2, P3 have been replaced with power transistors TM, TP1, TP2, TP3 that are not designed to provide optimal efficiency and/or power when implemented in a 50 Ohm environment. For that reason, input matching networks $Zinx_{match}$ and output matching networks $Zoutx_{match}$ are provided at the inputs and outputs of the power transistors, respectively, that provide the required impedance match to 50 Ohm. These matching networks generally act as impedance inverters as they introduce a phase delay that approximates 90 degrees. Hence, the inclusion of these matching networks needs to be compensated for. More in particular, comparing FIGS. 1 and 4, first branch b1 now comprises output match $Zout3_{match}$, which introduces a phase delay of about 90 degrees. In FIG. 1, branch b1 does not, in itself, comprise impedance transforming elements other than a transmission line that introduces a phase delay equaling a multiple times 180 degrees. Therefore, to get the same phase response, a phase delay element $Z_{01}$ having an electrical length of a 90 degrees is included in branch b1. Phase delay element $Z_{01}$ could be realized using a quarter-wavelength transmission line with a characteristic impedance of 50 Ohm. The combination of power transistor TP3 and output matching network $Zout3_{match}$ behaves, at least at the output, as an amplifier that is designed to provide optimal performance when connected to a load of 50 Ohm, which amplifier is connected to a quarter-wavelength transmission line of 50 Ohm.

On the other hand, impedance inverters $Z_{03}$, $Z_{05}$ from FIG. 1 have been replaced with output matching networks $Zout3_{match}$ and $Zout5_{match}$, respectively. These matches already provide the required impedance inversion and phase delay. In the numerical example above, both $Z_{03}$, $Z_{05}$ were set/computed to be 50 Ohm. In other words, according to the numerical example, amplifiers M and P1 in FIG. 1 are connected to a 50 Ohm quarter-wavelength transmission line. However, power transistor TM combined with output matching network $Zout0_{match}$ and power transistor TP1 combined with output matching network $Zout1_{match}$ both behave as an amplifier that is designed for 50 Ohm and which is connected to a 50 Ohm quarter-wavelength transmission line. Additional components are therefore not required.

If the numerical example resulted in any of the impedances $Z_{03}$, $Z_{05}$ being unequal to 50 Ohm, for example $Z_{05}$ would have equaled 25 Ohm, the same output matching network $Zout1_{match}$ could have been used albeit in combination with a 50 Ohm quarter-wavelength transmission line and a 25 Ohm quarter-wavelength transmission line connected in series.

By using the quadrature hybrid couplers, the input power is optimally distributed if each of the output ports of H2 and H3 is matched to 50 Ohm. This is achieved using the various input matching networks. The main purpose of distribution network 3 is to distribute the inputted power. Unlike Doherty combiner 4, load modulation is not, or not as much, required in distribution network 3.

Branch b7 in FIG. 1 requires a phase delay of 270 degrees plus a multiple times 180 degrees. In FIG. 4, couplers H1 and H2 already introduce a 180 degrees phase delay in total. The missing 90 degrees is provided by input matching network $Zin3_{match}$. Similar as above, the combination of input matching network $Zin3_{match}$ and TP3, which has not been designed to optimally perform when connected to a 50 Ohm environment at its input, behaves as an amplifier that has been designed to optimally perform in a 50 Ohm environment and which amplifier is connected to a 50 Ohm quarter-wavelength transmission line. Similar considerations hold for branches b9 and b10.

In branch b8, couplers H1 and H2 already introduce a phase delay of 90 degrees, whereas FIG. 1 indicates that phase delay of 90 degrees plus a multiple of 180 degrees is required in total for branch b8. Here, input matching network $Zin0_{match}$ introduces an additional 90 degrees. For that reason, an additional quarter-wavelength is introduced by means of phase delay element $Z_{09}$, which could be realized using a 50 Ohm quarter-wavelength transmission line.

In the numerical example above, $R_L$ was set to 1/4, which corresponds to 12.5 Ohm. In the FIG. 4 implementation, impedance inverter $Z_{OUT}$ is realized using a quarter-wavelength transmission line having a characteristic impedance of 25 Ohm to provide a match to the 50 Ohm load of the Doherty amplifier.

Figure 5:
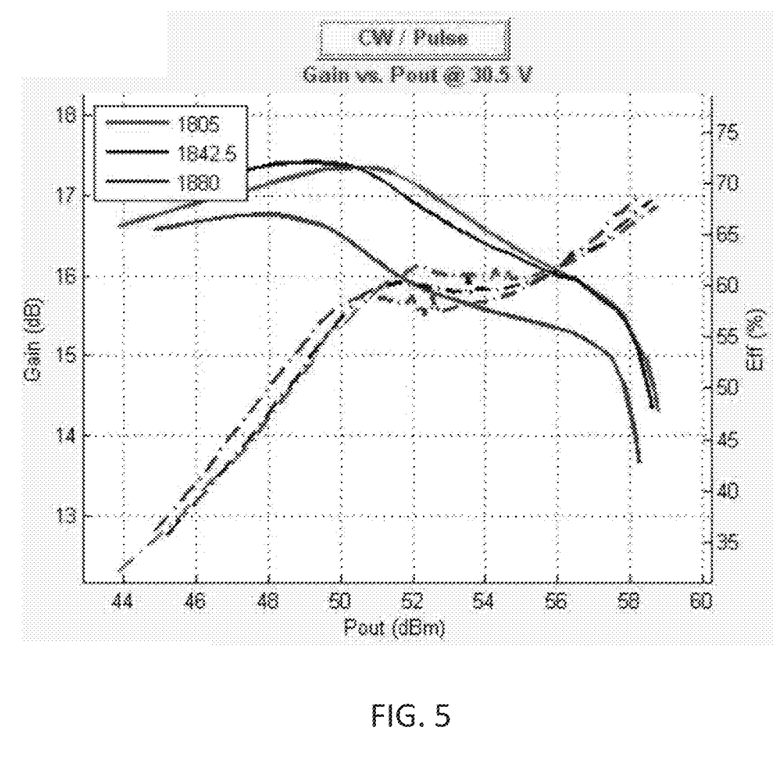
FIG. 5 illustrates the gain and efficiency of the amplifier in FIG. 4 as a function of output power for three distinct frequencies in a given communication band.

FIG. 5 illustrates the gain and efficiency of the amplifier in FIG. 4 as a function of output power for three distinct frequencies in a given communication band. Peak power is achieved at roughly 58.5 dBm and the efficiency peak under back-off conditions lies roughly at 51.5 dBm. This demonstrates that the present invention allows peak efficiencies to be obtained at deeper back-off levels than with conventional Doherty topologies.

Figure 6:
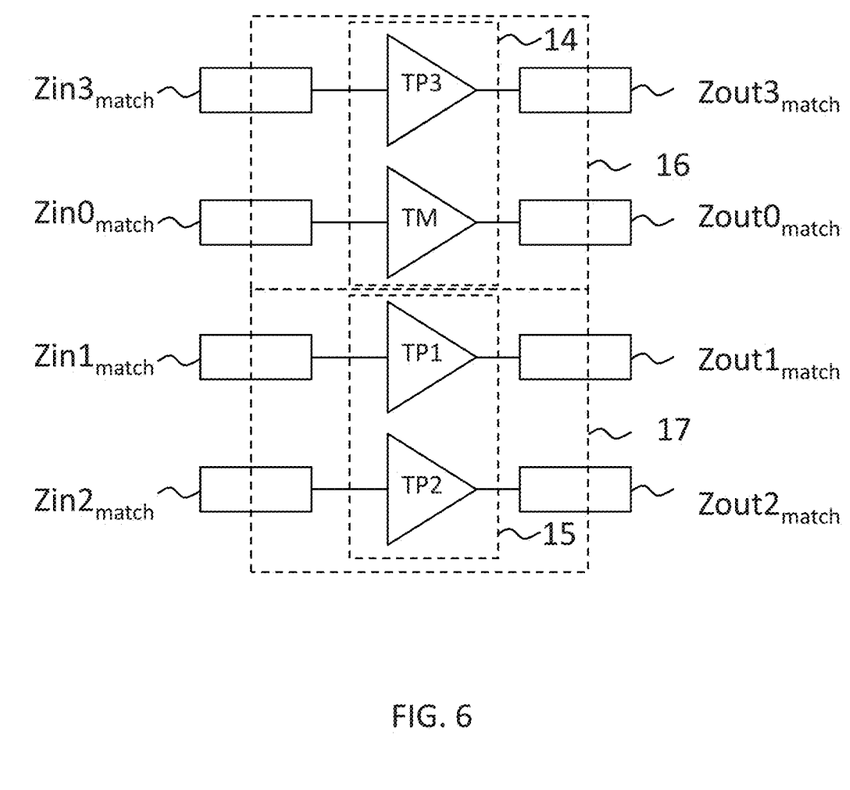
FIG. 6 illustrates possible die and package implementations to be used with the amplifier of the present invention.

FIG. 6 illustrates possible die and package implementations to be used with the amplifier of the present invention. The power transistors TP3 and TM can be realized on a single semiconductor die 14. Moreover, this die can be placed in a package 16 that also includes at least part of the required input and output matching networks. In some embodiments, part of the matching networks is arranged on semiconductor die 14.

Similar considerations hold for power transistors TP1 and TP2. They can also be realized on a single semiconductor die 15. This die can be placed in a package 17 that also includes at least part of the required input and output matching networks. In some embodiments, part of the matching networks is arranged on semiconductor die 15.

The present invention does neither exclude embodiments wherein each power transistor is realized on a separate die, which die is mounted in a separate package, nor embodiments wherein all power transistors are realized on the same die.

If an equal power capacity is used for the power transistors, substantially identical dies and packages can be used. This considerably reduces the costs of manufacturing.

In the description above, electrical elements were presented that have a specific purpose. The skilled person in the art is aware that alternative elements may be used as long as these elements have the same purpose or display substantially the same electrical behavior. For example, a quarter-wavelength transmission line can be replaced by a pi-network as discussed above. The invention is therefore not limited to a particular implementation of a given electrical element.

Moreover, the skilled person will understand that the scope of the present invention is not limited to the embodiments discussed here, but is defined by the appended claims and their equivalents.

The invention claimed is:

1. A four-way Doherty amplifier, comprising:
   an input terminal (1) for receiving a signal to be amplified by the four-way Doherty amplifier;
   a main amplifier (M) having a main input and a main output;
   a first peak amplifier (P1) having a first input and a first output;
   a second peak amplifier (P2) having a second input and a second output;
   a third peak amplifier (P3) having a third input and a third output;
   an input distribution network (3) for distributing the signal received at the input terminal to the main amplifier, the first peak amplifier, the second peak amplifier, and the third peak amplifier; and
   a Doherty combiner (4) for combining, at a first combining node (N1), signals received from the main amplifier, the first peak amplifier, the second peak amplifier, and the third peak amplifier, said Doherty combiner comprising:
      a second branch (b2) between the first combining node (N1) and a second combining node (N2) and comprising a second impedance inverter ($Z_{o2}$), wherein the third output is connected to the first combining node (N1) via a first branch (b1);
      a third branch (b3) between the second combining node (N2) and the main output and comprising a third impedance inverter ($Z_{o3}$);
      a fourth branch (b4) between the second combining node (N2) and a third combining node (N3) and comprising a fourth impedance inverter ($Z_{o4}$), wherein the second output is connected to the third combining node (N3) via a sixth branch (b6); and
      a fifth branch (b5) between the first output and the third combining node (N3) and comprising a fifth impedance inverter ($Z_{o5}$)
   wherein maximum power capacities of the main amplifier, the first peak amplifier, the second peak amplifier, and the third peak amplifier are substantially identical,
   wherein a supply voltage supplied to the main amplifier, the first peak amplifier, the second peak amplifier, and the third peak amplifier is substantially identical, and
   wherein the first, second, and third peak amplifiers are configured to turn-on at substantially the same power level of the signal inputted to the Doherty amplifier.

2. The four-way Doherty amplifier of claim 1, wherein a signal outputted by the second peak amplifier first combines with a signal outputted by the first peak amplifier at the third combining node to thereby form a first combined signal;
   wherein a signal outputted by the main amplifier first combines with the first combined signal at the second combining node to thereby form a second combined signal; and
   wherein a signal outputted by the third peak amplifier first combines with the second combined signal at the first combining node.

3. The four-way Doherty amplifier of claim 1, wherein the input distribution network and the Doherty combiner are configured such that the signals amplified by the main amplifier, the first peak amplifier, the second peak amplifier, and the third peak amplifier, add substantially in-phase at the first combining node.

4. The four-way Doherty amplifier of claim 1, further comprising an output terminal (2) for outputting the combined signals to a load ($R_{LOAD}$), and an output impedance inverter ($Z_{OUT}$) arranged in between the first combining node (N1) and the output terminal (2).

5. The four-way Doherty amplifier of claim 1, wherein the input distribution network comprises:
   a seventh branch between the input terminal and the third input;
   an eighth branch in between the input terminal and the main input;
   a ninth branch between the input terminal and the first input;
   a tenth branch between the input terminal and the second input;
   wherein:
   the seventh branch is configured to introduce a phase delay between the input terminal and the third input that substantially equals $(270+(n_7 \times 180))$ degrees);
   the eighth branch is configured to introduce a phase delay between the input terminal and the main input that substantially equals $(90+(n_8 \times 180))$ degrees);
   the ninth branch is configured to introduce a phase delay between the input terminal and the first input that substantially equals $(n_9 \times 180$ degrees); and
   the tenth branch is configured to introduce a phase delay between the input terminal and the second input that substantially equals $(90+(n_{10} \times 180))$ degrees)
   wherein $n_7$, $n_8$, $n_9$, and $n_{10}$ are integer numbers.

6. The four-way Doherty amplifier of claim 5, wherein:
   the seventh branch comprises a seventh impedance inverter;
   the eighth branch comprises an eighth impedance inverter; and
   the tenth branch comprises a tenth impedance inverter.

7. The four-way Doherty amplifier of claim 1, wherein the input distribution network comprises a first quadrature hybrid coupler (H1), a second quadrature hybrid coupler (H2), and a third quadrature hybrid coupler (H3), each of the first, second, and third quadrature hybrid couplers comprising a coupler input node, a first coupler output node, a second coupler output node, and a coupler isolated node that is terminated with a predefined load, wherein:
   the input terminal is connected to the coupler input node of the first quadrature hybrid coupler;
   the second coupler output node of the first quadrature hybrid coupler is coupled to the coupler input node of the second quadrature hybrid coupler, and the first coupler output node of the first quadrature hybrid coupler is coupled to the coupler input node of the third quadrature hybrid coupler;

the first coupler output node of the second quadrature hybrid coupler is coupled to the main input;

the first coupler output node of the third quadrature hybrid coupler is coupled to second input;

the second coupler output node of the second quadrature hybrid coupler is coupled to third input;

the second coupler output node of the third quadrature hybrid coupler is coupled to first input;

wherein the input distribution network further comprises an ninth impedance inverter ($Z_{O9}$) arranged in between the first coupler output node of the second quadrature hybrid coupler and the main input.

8. The four-way Doherty amplifier according to claim 1, wherein each amplifier of the main amplifier, the first peak amplifier, the second peak amplifier, and the third peak amplifier, comprises a power transistor (10, 11, 12, 13) having a transistor input and a transistor output;

the four-way Doherty amplifier further comprising:

a main input matching network $Zin0_{match}$ connected to the transistor input of the power transistor of the main amplifier;

a first input matching network $Zin1_{match}$ connected to the transistor input of the power transistor of the first peak amplifier;

a second input matching network $Zin2_{match}$ connected to the transistor input of the power transistor of the second peak amplifier;

a third input matching network $Zin3_{match}$ connected to the transistor input of the power transistor of the third peak amplifier;

a main output matching network $Zout0_{match}$ connected to the transistor output of the power transistor of the main amplifier;

a first output matching network $Zout1_{match}$ connected to the transistor output of the power transistor of the first peak amplifier;

a second output matching network $Zout2_{match}$ connected to the transistor output of the power transistor of the second peak amplifier; and a third output matching network $Zout3_{match}$ connected to the transistor output of the power transistor of the third peak amplifier, wherein the first, second, third, fourth, and fifth impedance inverters comprise a quarter-wavelength transmission line, such as a quarter-wavelength micro-strip line, or an electrical equivalent thereof;

wherein the first branch is configured to introduce a phase delay between the third output and the first combining node (N1) that substantially equals $n_1 \times 180$ degrees;

wherein the second branch is configured to introduce a phase delay between the second combining node (N2) and the first combining node (N1) that substantially equals $(90+(n_2 \times 180))$ degrees;

wherein the third branch is configured to introduce a phase delay between the main output and the second combining node that substantially equals $(90+(n_3 \times 180))$ degrees);

wherein the fourth branch is configured to introduce a phase delay between the third combining node and the second combining node that substantially equals $(90+(n_4 \times 180))$ degrees);

wherein the fifth branch is configured to introduce a phase delay between the first output and the third combining node that substantially equals $(90+(n_4 \times 180))$ degrees);

wherein the sixth branch is configured to introduce a phase delay between the second output and the third combining node (N3) that substantially equals $n_6 \times 180$ degrees;

wherein $n_1$, $n_2$, $n_3$, $n_4$, $n_5$, and $n_6$ are integer numbers, and wherein the main output matching network $Zout0_{match}$ substantially forms the third impedance inverter ($Z_{O3}$), and wherein the first output matching network $Zout1_{match}$ substantially forms the fifth impedance inverter ($Z_{O5}$), and wherein the first branch comprises said third output matching network $Zout3_{match}$ and a phase delay component ($Z_{O1}$) for introducing a phase delay equaling $90+(n_1 \times 180)$ degrees, and wherein the sixth branch comprises said second output matching network $Zout2_{match}$ and a phase delay component ($Z_{O6}$) for introducing a phase delay equaling $90+(n_6 \times 180)$ degrees, wherein $n_1$ and $n_6$ are integer numbers.

9. The four-way Doherty amplifier according to claim 8, wherein at least two of the main input matching network $Zin0_{match}$, the first input matching network $Zin1_{match}$, the second input matching network $Zin2_{match}$, and the third input matching network $Zin3_{match}$, are identical; and wherein at least two of the main output matching network $Zout0_{match}$, the first output matching network $Zout1_{match}$, the second output matching network $Zout2_{match}$, and the third output matching network $Zout3_{match}$, are identical.

10. The four-way Doherty amplifier according to claim 8, wherein the power transistors of the main amplifier and the third peak amplifier are arranged on a single semiconductor die (14), and/or wherein the power transistors of the first peak amplifier and the second peak amplifier are arranged on a single semiconductor die (15), or wherein the power transistors of the main amplifier, the first peak amplifier, the second peak amplifier, and the third peak amplifier are integrated on a single die.

11. The four-way Doherty amplifier according to claim 8, wherein at least part of the input and/or output matching network corresponding to the power transistor of the main amplifier, the first peak amplifier, the second peak amplifier, and the third peak amplifier are integrated on the same die as said power transistor.

12. The four-way Doherty amplifier according to claim 8, wherein the power transistors of the main amplifier and the third amplifier are integrated in a single package (16), and/or wherein the power transistors of the first amplifier and the second amplifier are integrated in a single package (17), or wherein the power transistors of the main amplifier, the first peak amplifier, the second peak amplifier, and the third peak amplifier are integrated in a single package.

13. The four-way Doherty amplifier according to claim 12, wherein at least part of the input and/or output matching network corresponding to the power transistor of the main amplifier, the first peak amplifier, the second peak amplifier, and the third peak amplifier are integrated in the same package as said power transistor.

14. The four-way Doherty amplifier according to claim 8, wherein the main amplifier, the first peak amplifier, the second peak amplifier, and the third peak amplifier are identical.

15. A mobile telecommunications base station comprising the four-way Doherty amplifier as defined in claim 1.

* * * * *